United States Patent [19]
Waters

[11] Patent Number: 5,422,584
[45] Date of Patent: Jun. 6, 1995

[54] VARIABLE PHASE SINE WAVE GENERATOR FOR ACTIVE PHASED ARRAYS

[75] Inventor: William M. Waters, Millersville, Md.

[73] Assignee: The United States of America as represented by the Secretary of the Navy, Washington, D.C.

[21] Appl. No.: 953,380

[22] Filed: Sep. 30, 1992

[51] Int. Cl.$^6$ .................. H03B 19/00; H03L 7/00
[52] U.S. Cl. ........................... 327/113; 327/129
[58] Field of Search .............. 307/219.1, 271; 328/14, 328/15, 21, 22; 327/113, 129, 232, 237

[56] References Cited

U.S. PATENT DOCUMENTS

| | | | |
|---|---|---|---|
| 3,486,134 | 12/1969 | Seidel | 307/271 X |
| 3,512,092 | 5/1970 | Thurnell | 328/14 |
| 3,529,260 | 9/1970 | Noyes, Jr. | 328/22 X |
| 3,617,769 | 11/1971 | Hanson | 307/271 X |
| 3,660,766 | 5/1972 | Hilliard, Jr. | 328/14 |
| 3,873,928 | 3/1975 | Lafuze | 328/14 |
| 4,468,794 | 8/1984 | Waters et al. | 375/103 |
| 4,665,372 | 5/1987 | Schwartz | 332/9 |
| 4,823,090 | 4/1989 | Coleman et al. | 328/114 |
| 4,851,783 | 7/1989 | Rabiger | 328/15 |
| 5,097,218 | 3/1992 | Cooper | 307/271 X |
| 5,113,094 | 5/1992 | Grace et al. | 307/271 X |
| 5,194,820 | 3/1993 | Besson et al. | 307/271 X |

OTHER PUBLICATIONS

Reference Data for Engineers: Radio, Electronics, Computer and Communications, 7th Edition, Howard W. Sams & Co., Inc., Jan.–1985, pp. 8-3 and 8-4.

*Primary Examiner*—Willis R. Wolfe
*Attorney, Agent, or Firm*—Thomas E. McDonnell; Edward F. Miles

[57] ABSTRACT

A waveform generator is provided for generating a high frequency waveform. A pulse generator provides a pulse train at a low frequency. A pulse converter converts the pulse train into an alternatingly positive and negative groups of pulses. A bandpass filter passes the alternatingly positive and negative groups of pulses in a frequency band centered at the high frequency to output the generated waveform at the high frequency. When the groups of pulses are a pair of pulses, a sine wave is output from the bandpass filter. A pulse delay circuit can be used to variably delay the pulse train and thereby cause a phase change in the generated waveform.

18 Claims, 3 Drawing Sheets

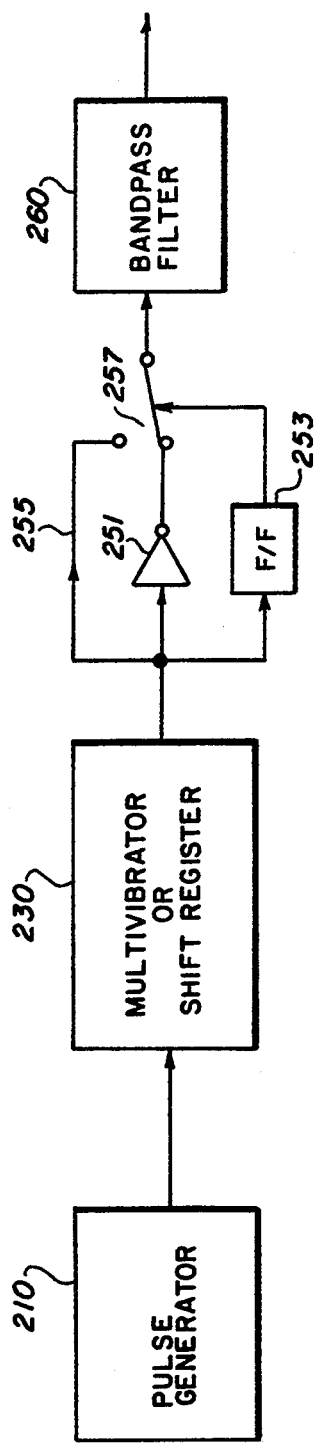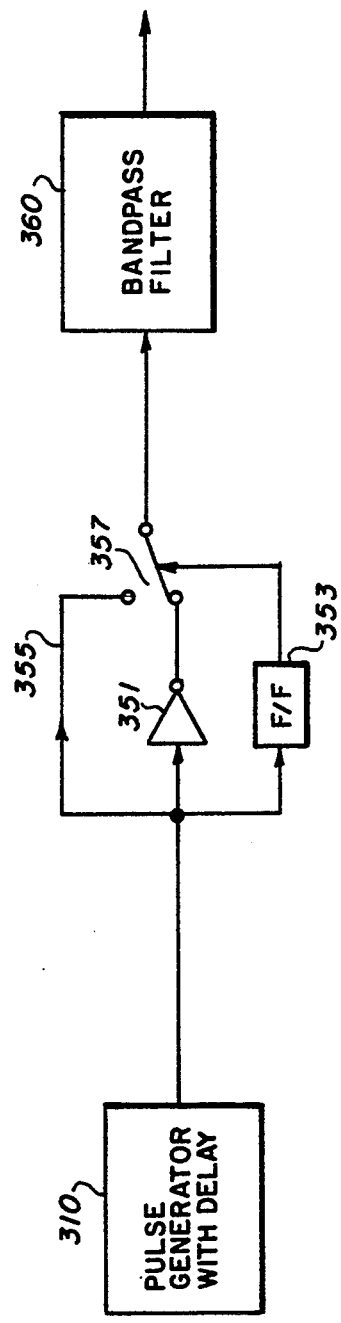
FIG. 3
FIG. 4

VARIABLE PHASE SINE WAVE GENERATOR FOR ACTIVE PHASED ARRAYS

BACKGROUND OF THE INVENTION

1. Field of the Invention

This invention relates to a waveform generator and, more particularly, relates to a waveform generator utilizing a bandpass filter to convert alternatingly positive and negative groups of pulses into an output waveform.

2. Description of the Related Art

Waveform generators have been built in the prior art using conventional oscillators and digital or analog components. One important use of such oscillators is in phase array radar system, which requires generation of sinusoids at precisely selected frequencies, and having precisely selected phases with respect to one another. However, as the frequencies used by these systems increase, the cost of higher frequency components also increases, and does so drastically. Furthermore, when phase variation of a generated high frequency waveform is needed, additional complex circuitry is required for high frequency phase variation.

SUMMARY OF THE INVENTION

It is therefore an object of the present invention to provide a high frequency waveform generator.

It is another object of the present invention to provide a high frequency waveform generator which uses low frequency waveform generating components.

It is still another object of the present invention to provide a waveform generator with a capability for simple phase control.

Another object of the present invention is to provide a high frequency waveform generator using low frequency components for phase control.

To achieve the foregoing and other objects, in accordance with the present invention as described herein, a waveform generator is provided to output a generated high frequency waveform at a frequency $f_0$. The apparatus has a pulse generator which produces a pulse train at a selected frequency $f_s$, in which $f_0$ and $f_s$ are defined by:

$$f_s = (4f_0)/(2m-1)$$

where m is an integer greater than zero. An amplitude adjuster sets the amplitude of the pulses to preselected values, and a converter reverses the polarity of selected pulses in said pulse train. The converter and the amplitude adjuster cooperate to cause the pulse train to correspond to one which would result from a sinusoid at $f_0$ digitally sampled at $f_s$.

The equation relating $f_0$ and $f_s$ is known, e.g. from U.S. Pat. No. 4,468,794 to Waters et al. (the disclosure of which is incorporated herein by reference), and in effect says that, for a perfectly periodic waveform, one can sample it without loss of information at $f_s$, which is lower than the Nyquist frequency. (Indeed, for m large, one can sample very near D.C.). Because of this, the pulse train will necessarily have a harmonic at $f_0$. The inventor has realized that, if, as described above, one synthetically generates a pulse train which would result from a high frequency sinusoid at $f_0$ sampled at $f_s$, the pulse train will have a harmonic at $f_0$, which can be extracted by conventional filtering. The result, according to the invention, is a high frequency sinusoid generated by lower frequency equipment. Such equipment is inherently simpler and less expensive.

In one embodiment of the invention, two or more such pulse trains are generated, and their relative phase adjusted. Harmonics extracted from these trains will maintain the phasing imposed on the pulse trains, resulting in a set of (nominally identical frequency) sinusoids with preselected phase, which is especially well suited to the needs of a phased array radar.

In another embodiment, the pulses in the pulse train are in sequential pairs of the same polarity, with alternating pairs being of opposite polarity. Because of the symmetry of sinusoids, this arrangement is the only one consistent with the sampling equation, given above, which yields pulses of the same amplitude. Using the same amplitude pulses reduces the complexity of the electronics necessary to generate the pulse trains, thus further reducing cost.

The above-mentioned and other objects and features of the present invention will become more apparent from the following description when read in conjunction with the accompanying drawings. However, the drawings and description are merely illustrative in nature and not restrictive.

BRIEF DESCRIPTION OF THE DRAWINGS

FIG. 3 illustrates a schematic block diagram of an alternative embodiment of the waveform generator of the present invention; and FIG. 4 illustrates a schematic block diagram of another alternative embodiment of the waveform generator of the present invention.

DESCRIPTION OF THE PREFERRED EMBODIMENTS

Figure 1:
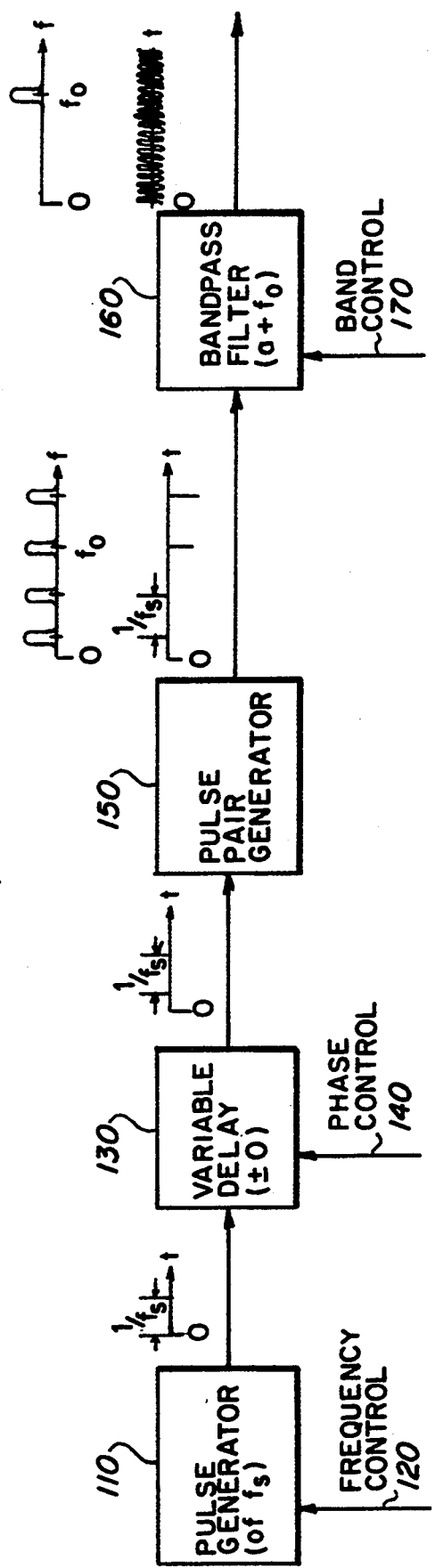
FIG. 1 illustrates a schematic block diagram of the waveform generator of the present invention.

FIG. 1 illustrates a schematic block diagram of the components of an embodiment of the present invention. A pulse generator 110 generates a pulse train at a frequency of $f_s$. The frequency $f_s$ can be varied, if desired, by a frequency control input 120. As an example, the frequency $f_s$ of the pulse train generated by the pulse generator 110 can be at 5.128 MHz. Thus, the train of pulses will then have a period of $1/f_s$ or 195 ns. The pulse generator can be built from a multivibrator such as a Texas Instruments delay multivibrator Part No. TTL74121 and can be crystal controlled. The pulse generator 110 can also be a pulse generator chip or laboratory waveform generator such as a Hewlett Packard HP8643A waveform generator.

A variable delay circuit 130 receives the pulse train from the pulse generator 110 to cause a shift in the pulse train. The variable delay circuit 130 has a phase control input 140 for controlling the amount of delay caused by the variable delay circuit. The amount of delay caused by the variable delay circuit 130 should be less than one sampling $1/f_0$, the period of the sine wave to be generated, so that the pulses will not overlap. When the pulse train has the exemplary frequency $f_s$ of 5.128 MHz, as discussed above, the delay should vary between 0 and about 195 ns.

The variable delay circuit 130 can also be provided by a delay multivibrator chip such as Texas Instruments Part No. TTL74121 delay multivibrator. The variable delay 130 can also be provided by a shift register having a variable pick off controlled by the phase control 130. The pulse generator 110 and the variable delay circuit 130 can also be formed as a single circuit.

The pulse train from the variable delay circuit 130 is converted to pulse pairs by a pulse pair generator 150. The pulse pair generator 150 converts the pulse train into alternatingly positive and negative pairs of pulses. Besides pairs of pulses, the pulse pair generator 150 can also be implemented to convert the pulse train into alternatingly positive and negative groups of any number of pulses. Different types of waveform can thus be generated by adjusting the number of pulses in each group output of the pulse pair generator 150. For generation of a sine wave, or of course a cosine wave, pairs of pulses are preferred.

The pulse pair generator 150 is preferably built from an invertor, a divide-by-two flip-flop and a switch to generate alternatingly positive and negative pairs of pulses. The connection and operation of these components will later be described below with reference to FIGS. 3 and 4.

The frequency $f_0$ is preferably an order of magnitude greater than the frequency $f_s$ according to the following relationship:

$$f_s = \frac{4f_0}{2m - 1} \quad (1)$$

wherein m is an integer greater than 0.

The frequency $f_s$ is preferably an order of magnitude lower than $f_0$: the closer together $f_0$ is to $f_s$, the closer are the harmonics in the pulse train, and the more complicated and expensive the filter must be to extract the desired harmonic at $f_0$. An order of magnitude difference should permit one to get good results using inexpensive and readily available filters.

According to the above example where $f_s$ is 5.128 MHz, the exemplary frequency of $f_0$ for the bandpass filter 160 is thus 50 MHz when m=20 in the equation (1). Thus, a waveform is output from the bandpass filter 160 having a frequency approximately an order of magnitude greater than the frequency of the signals generated by the components of the pulse generator 110 or the variable delay circuit 130.

The bandpass filter 160 preferably has a 3.2 MHz bandwidth at its 3 dB point and a 8 MHz bandwidth at its 50 dB point in the above example. The bandpass filter 160 can be designed for any frequency $f_0$ using known bandpass filter designs. For example, well-known bandpass filter designs are provided in reference books such as *Reference Data for Engineers: Radio, Electronics, Computer and Communications*, Howard W. Sams & Co., Inc., 7th Edition, 1985, which is incorporated herein by reference. On page 8-4 of this reference book, Table I and filter circuit "C" provide design parameters to build a bandpass filter for use as the bandpass filter 160.

Figure 2:
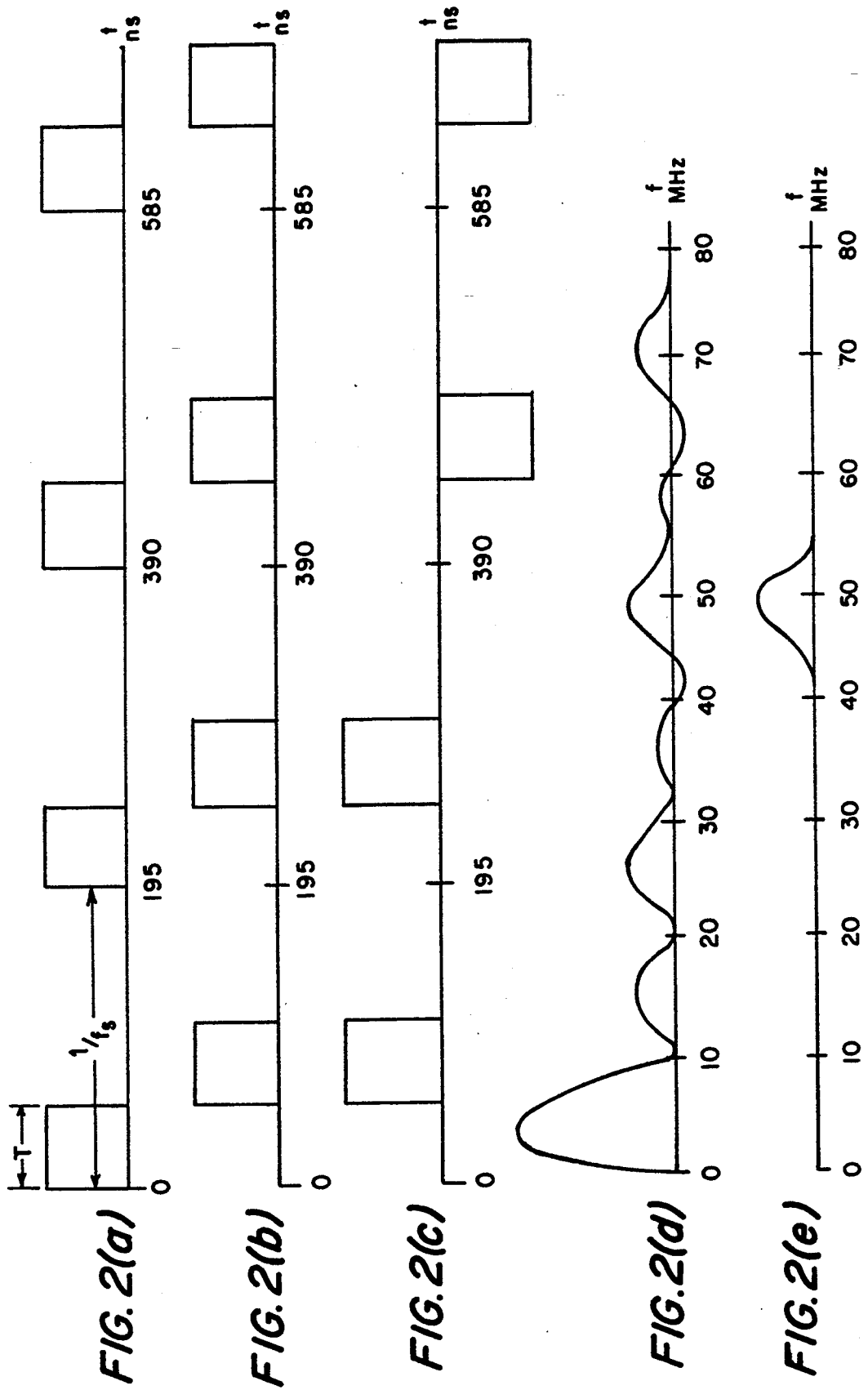
FIGS. 2(a) through 2(e) illustrate timing diagrams of signals in the time and frequency domains generated by the components of the waveform generator of the present invention.

FIGS. 2(a) through 2(e) illustrate timing diagrams in the time and frequency domains of signals at various points in the circuitry of the present invention. FIG. 2(a) illustrates a timing diagram of the pulse train output of the pulse generator 110. For the exemplary frequency $f_s$ of 5.128 MHz, the pulse train has a period of 195 ns as illustrated in FIG. 2(a). Preliminary computer simulations have indicated that, for this example, pulse pairs having a pulse width of about 50 ns appear to maximize the energy in the desired frequency of 50 MHz.

FIG. 2(b) illustrates a time domain timing diagram of the variably delayed pulse train output of the variable delay circuit 130 for the exemplary frequency $f_s$ of 5.128 MHz. FIG. 2(c) illustrates a time domain timing diagram of the alternatingly positive and negative group of pulses output of the pulse pair generator 150 for the exemplary frequency $f_s$ of 5.128 MHz.

FIGS. 2(d) and 2(e) illustrate frequency spectra plots for the waveforms respectively input to and output from the bandpass filter 160 for the exemplary frequencies $f_s$ of 5.128 MHz and $f_0$ of 50 MHz. The plot of FIG. 2(d) corresponds to a frequency spectrum of the alternatingly positive and negative pairs of pulses illustrated in the time domain timing diagram of FIG. 2(c). The frequency spectrum plot of FIG. 2(d) has a 50 MHz component which can be extracted by the bandpass filter 160 to produce the frequency spectrum plot of FIG. 2(e). The spectrum plot of FIG. 2(e) corresponds to a sine wave in the time domain.

FIG. 3 illustrates a schematic block diagram of an alternative embodiment of the waveform generator of the present invention. A pulse train is output from a pulse generator 210 and variably delayed in either a multivibrator or a shift register of a block 230. As discussed in detail above, a variable delay can be obtained by a multivibrator such as a Texas Instruments delay multivibrator Part No. TTL74121 or a shift register with a variable pickoff.

A pulse pair generator is provided in the circuit FIG. 3 by an invertor 251 and a divide-by-two flip-flop 253. The divide-by-two flip-flop 253 receives the pulse train and controls a switch 257. The switch 257 can be made from a pair of transistors with the invertor 251 on one of the transistor's inputs. The switch 257 passes either an inverted pulse train from the invertor 251 or a non-inverted pulse train through a connection 255. Therefore, the switch 257 produces an output of alternatingly positive and negative pairs of pulses as illustrated in FIG. 2(c). Groups of any integral number of pulses greater than two are possible if the divide-by-two flip-flop 253 is replaced by a divider for dividing by the integral number of pulses desired. The alternatingly positive and negative groups of pulses output by the switch 257 are then bandpass filtered in the bandpass filter 260 illustrated in FIG. 3.

FIG. 4 illustrates a schematic block diagram of the waveform generator of the present invention. In FIG. 4 a pulse generator 310 is illustrated having internal circuitry for causing a phase shift or delay of the pulse train output therefrom. This pulse generator 310 with delay can be built in many different known configurations or can be built as discussed above, for example, from a delay multivibrator chip. FIG. 4 also illustrates an invertor 351 and a flip-flop 353 connected to a switch 357 to provide a pulse pair generator as discussed above with respect to FIGS. 1 and 3. The alternatingly positive and negative groups of pulses output of the switch 357 are passed to a bandpass filter 360 to provide the output waveform.

The waveform generator of the present invention can be used to provide a variable sine wave. A large number of sine wave generators can be monolithically formed on a single substrate to generate plurality of variable phase sine waves for driving a phased array antenna.

While the invention has been illustrated and described in detail in the drawings and foregoing description, it will be recognized that many changes and modifications will occur to those skilled in the art. It is therefore intended by the appended claims, to cover such changes and modifications that fall within the true spirit and scope of the invention.

What is claimed is:

1. A sine wave generator apparatus, comprising:
   a pulse generator disposed to provide a pulse train at a first frequency;
   a pulse pair converter operatively connected to said pulse generator to convert the pulse train into alternatingly positive and negative pairs of pulses; and
   a bandpass filter operatively connected to said pulse pair converter to pass said alternatingly positive and negative pairs of pulses within a frequency band centered at a second frequency and provide the sine wave at the second frequency;
   wherein said pulse generator comprises a variable delay element operatively connected to variably delay the pulse train and change a phase of the sine wave.

2. A sine wave generator apparatus, comprising:
   a pulse generator disposed to provide a pulse train at a first frequency;
   a pulse pair converter operatively connected to said pulse generator to convert the pulse train into alternatingly positive and negative pairs of pulses; and
   a bandpass filter operatively connected to said pulse pair converter to pass said alternatingly positive and negative pairs of pulses within a frequency band centered at a second frequency and provide the sine wave at the second frequency;
   wherein said pulse pair converter comprises:
   an invertor operatively connected to receive the pulse train from said pulse generator to provide an inverted pulse train;
   a pulse train divide circuit operatively connected to receive the pulse train; and
   a switch selectively connected to couple the pulse train or the inverted pulse train in response to said pulse train divide circuit.

3. A sine wave generator apparatus, comprising:
   a pulse generator disposed to provide a pulse train at a first frequency;
   a pulse pair converter operatively connected to said pulse generator to convert the pulse train into alternatingly positive and negative pairs of pulses; and
   a bandpass filter operatively connected to said pulse pair converter to pass said alternating positive and negative pairs of pulses within a frequency band centered at a second frequency and provide the sine wave at the second frequency;
   wherein said bandpass filter passes a band of frequencies centered at the second frequency, wherein the second frequency is approximately an order of magnitude greater than the first frequency; and
   wherein the second frequency is approximately $4/(2m-1)$ times the first frequency and m is an integer greater than zero.

4. A sine wave generator apparatus, comprising:
   a pulse generator disposed to provide a pulse train at a first frequency;
   a pulse pair converter operatively connected to said pulse generator to convert the pulse train into alternatingly positive and negative pairs of pulses; and
   a bandpass filter operatively connected to said pulse pair converter to pass said alternatingly positive and negative pairs of pulses within a frequency band centered at a second frequency and provide the sine wave at the second frequency;
   wherein said bandpass filter passes a band of frequencies centered at the second frequency, wherein the second frequency is approximately an order of magnitude greater than the first frequency; and
   wherein said bandpass filter comprises a digital filter.

5. A sine wave generator apparatus, comprising:
   a pulse generator disposed to provide a pulse train at a first frequency;
   a pulse pair converter operatively connected to said pulse generator to convert the pulse train into alternatingly positive and negative pairs of pulses; and
   a bandpass filter operatively connected to said pulse pair converter to pass said alternatingly positive and negative pairs of pulses within a frequency band centered at a second frequency and provide the sine wave at the second frequency;
   wherein said pulse generator generates the pulse train with a duty cycle less than fifty percent; and
   wherein said pulse generator generates the pulse train with a duty cycle of approximately twenty-five percent.

6. A waveform generator apparatus, comprising:
   pulse generator means for generating alternatingly positive and negative groups of pulses at a first frequency; and
   bandpass filter means for passing the positive and negative groups of pulses in a pass band at a second frequency approximately an order of magnitude greater than the first frequency to output a waveform; and
   further comprising a means for variably delaying the pulse train and change a phase of the waveform.

7. A waveform generator apparatus, comprising:
   pulse generator means for generating alternatingly positive and negative groups of pulses at a first frequency; and
   bandpass filter means for passing the positive and negative groups of pulses in a pass band at a second frequency approximately an order of magnitude greater than the first frequency to output a waveform; and
   wherein the second frequency is approximately $4/(2m-1)$ times the first frequency and m is an integer greater than zero.

8. A signal generator comprising:
   a pulse generator, said generator comprising:
   means for generating a first and a second train of pulses at a pulse repetition frequency of $f_s$, each said pulse train having a pulse repetition period of $1/f_s$;
   means for phase shifting said first and said second pulse trains with respect to one another by an amount less than said $1/f_0$; and
   means for adding said first and said second pulse trains together to produce a resultant pulse train;
   wherein said signal generator further comprises a means for filtering said resultant pulse train, said means for filtering comprising a filter having a center frequency substantially at $f_0$, said $f_0$ being:

$$f_0 = \frac{(2m-1)f_s}{4}$$

wherein said m is an integer greater than zero.

9. The signal generator of claim 8, wherein said generator further comprises means for causing said resultant pulse train to be a train of pulse pairs, each pulse in each said pulse pair being of the same polarity.

10. The generator of claim 8, wherein sequential ones of said pulse pairs are of the opposite polarity.

11. A sine wave generator apparatus, comprising:
a pulse generator disposed to provide a pulse train at a first frequency;
pulse pair converter operatively connected to said pulse generator to convert the pulse train into alternatingly positive and negative pairs of pulses; and
a bandpass filter operatively connected to said pulse pair converter to pass said alternatingly positive and negative pairs of pulses within a frequency band centered at a second frequency and provide the sine wave at the second frequency;
said generator further comprising a pulse delay circuit operatively connected between said pulse generator and said pulse pair converter to variably delay the pulse train and change a phase of the sine wave.

12. A sine wave generator according to claim 11, wherein said pulse delay circuit comprises a shift register.

13. A sine wave generator according to claim 11, wherein said pulse delay circuit comprises a multivibrator.

14. A sine wave generator according to claim 13, wherein said pulse generator comprises another multivibrator.

15. Apparatus for generating a sinusoid at a preselected frequency $f_0$, said apparatus comprising:
pulse generator means for producing a pulse train at a frequency $f_s$, said $f_s$ and $f_0$ being defined by:

$$f_s = (4f_0)/(2m-1)$$

where m is an integer greater than zero;
amplitude adjusting means for preselectedly setting the relative amplitude of the pulses in said pulse train with respect to one another;
converter means for reversing the polarity of selected pulses in said pulse train;
said converter means and said amplitude adjusting means cooperating to cause said pulse train to correspond to a pulse train which would result from a sinusoid at said $f_0$ digitally sampled at said $f_s$.

16. The apparatus of claim 15, wherein said pulse train is at least two pulse trains, said apparatus further comprising means for preselectedly adjusting the relative phases between/among said at least two pulse trains.

17. The apparatus of claim 15, wherein said amplitude adjusting means causes the absolute value of said pulses to be substantially the same.

18. The apparatus of claim 17, wherein said pulses in said pulse train are in the form of a sequence of pulse pairs, the pulses of each of said pair being of the same polarity, and alternating pairs being of opposite polarity.

* * * * *